(12) United States Patent  
Demirsoy et al.

(10) Patent No.: US 7,864,080 B1
(45) Date of Patent: Jan. 4, 2011

(54) SAMPLE RATE CONVERSION BY CONTROLLED SELECTION OF FILTER OUTPUTS

(75) Inventors: Suleyman Sirri Demirsoy, London (GB); Lawrence Rigby, Guildford (GB); Benjamin Esposito, Pittsboro, NC (US)

(73) Assignee: Altera Corporation, San Jose, CA (US)

( * ) Notice: Subject to any disclaimer, the term of this patent is extended or adjusted under 35 U.S.C. 154(b) by 59 days.

(21) Appl. No.: 12/345,045

(22) Filed: Dec. 29, 2008

(51) Int. Cl.
*H03M 7/00* (2006.01)
*G06F 17/17* (2006.01)

(52) U.S. Cl. ........................................ 341/61; 708/313

(58) Field of Classification Search .................. 341/61; 708/313, 322
See application file for complete search history.

(56) References Cited

U.S. PATENT DOCUMENTS 5,892,695 A * 4/1999 Van Dalfsen et al. ........ 708/313
6,134,268 A * 10/2000 McCoy ........................ 708/313
7,529,534 B2 * 5/2009 Koehler ....................... 455/334
2003/0172098 A1 * 9/2003 Jiang et al. ................... 708/313
2004/0263363 A1 * 12/2004 Biswas ......................... 341/61

OTHER PUBLICATIONS

Crochiere et al., Interpolation and Decimation of Digital Signals—Tutorial Review, Proceedings of the IEEE vol. 69, No. 3, Mar. 1981, pp. 300-331.*

Ang et al., Virtex FPGA Implementation of a Polyphase Filter for Sample Rate Conversion, Conference Record of the Thirty-Fourth Asilomar Conference on Signals, Systems and Computers, 2000, vol. 1, pp. 365-369, Meeting Date : Oct. 29, 2000-Nov. 1, 2000.*

* cited by examiner

*Primary Examiner*—Howard Williams
(74) *Attorney, Agent, or Firm*—Mauriel Kapouytian & Treffert LLP; Ararat Kapouytian

(57) ABSTRACT

A sample rate converter in which filtering is decomposed into phases as permitted by zero padding is described. The outputs of the phases are issued in the correct sequence to provide the resampled sequence.

19 Claims, 9 Drawing Sheets

SAMPLE RATE CONVERSION BY CONTROLLED SELECTION OF FILTER OUTPUTS

BACKGROUND

The invention relates to the field of digital signal processing and more particularly to the conversion of the sample rate of digital signals.

Sample rate conversion by a non-integer ratio is a requirement in some digital signal processing (DSP) applications, such as digital intermediate frequency (IF) modems, software defined radios (SDRs) and multistandard basestations.

SUMMARY

According to one aspect, an embodiment of the invention provides a sample rate converter for implementing the effect of a sequence of upsampling and downsampling processes operating in series on an input signal to produce a resampled signal. The aforementioned sequence of processes includes anti-aliasing filtering which can be represented as a polyphase decomposition into a set of phases due to zero padding in the upsampling process. The sample rate converter comprises a calculator and a selector. The calculator is for producing phase outputs, each phase output being the result of a particular phase operating on a particular section of the input signal. The selector is for selecting the phase outputs produced by the calculator directly into the correct sequence to produce the resampled signal.

Thus, the downsampling operation can be subsumed within the process of selecting phase outputs. This may permit a more efficient implementation of the overall sample rate conversion process, which efficiency saving can manifest itself as a reduction in the amount of hardware that is required to be implemented in silicon.

According to another aspect, an embodiment of the invention provides a sample rate converter for implementing the effect of a sequence of upsampling and downsampling processes operating in series on an input signal to produce a resampled signal. The aforementioned sequence of processes includes anti-aliasing filtering which can be represented as a polyphase decomposition into a set of phases due to zero padding in the upsampling process. The sample rate converter comprises a calculator and a controller. The calculator is for producing phase outputs, each phase output being the result of a particular phase operating on a particular section of the input signal. The controller is for repeatedly reconfiguring the calculator to cause the calculator to produce a sequence of phase outputs corresponding directly to the resampled signal.

Thus, the downsampling operation can be subsumed within the process of selecting phase outputs. This may permit a more efficient implementation of the overall sample rate conversion process, which efficiency saving can manifest itself as a reduction in the amount of hardware that is required to be implemented in silicon.

According to a further aspect, an embodiment of the invention provides a sample rate converter for implementing the effect of a sequence of upsampling and downsampling processes operating in series on an input signal to produce a resampled signal. The aforementioned sequence of processes includes anti-aliasing filtering which can be represented as a polyphase decomposition into a set of phases due to zero padding in the upsampling process. The sample rate converter comprises a multiplexer, a plurality of filters operating on the input signal to produce inputs to the multiplexer and control logic. The control logic is for reconfiguring the filters to implement different phases of the decomposition and for selecting which of the inputs to the multiplexer becomes its output. The control logic is also arranged to sequence the reconfiguration of the filter and the selection of the multiplexer output such that the multiplexer output is the resampled signal.

Thus, the downsampling operation can be subsumed within the process of selecting phase outputs. This may permit a more efficient implementation of the overall sample rate conversion process, which efficiency saving can manifest itself as a reduction in the amount of hardware that is required to be implemented in silicon.

The calculator may comprise a plurality of filters. These filters may be arranged to implement different phases of the decomposition to one another whilst being supplied with the input signal in order to contribute phase outputs for selection by a multiplexer or other selector into the resampled signal. Where such a plurality of filters is implemented, the sample rate converter may be designed such that at least one the plurality of filters is reconfigurable between configurations in which different phases of the decomposition are implemented. It may even be arranged such that the filters implement phases belonging to different sample rate conversion algorithms such that the filters can be reprogrammed to move between different sample rate conversion ratios.

A filter within the sample rate converter for implementing a phase of a decomposition will typically be a direct form finite impulse response (FIR) filter. Of course, other types of filter may be used, such as transposed form FIR filters.

The sample rate converter may form part of a piece of equipment such as an SDR and may be implemented in an application specific integrated circuit (ASIC) or in a field programmable gate array (FPGA) or other kind of hardware.

BRIEF DESCRIPTION OF THE DRAWINGS

The novel features of the invention are set forth in the appended claims. However, for purpose of explanation, several aspects of particular embodiments of the invention are described by reference to the following figures:

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
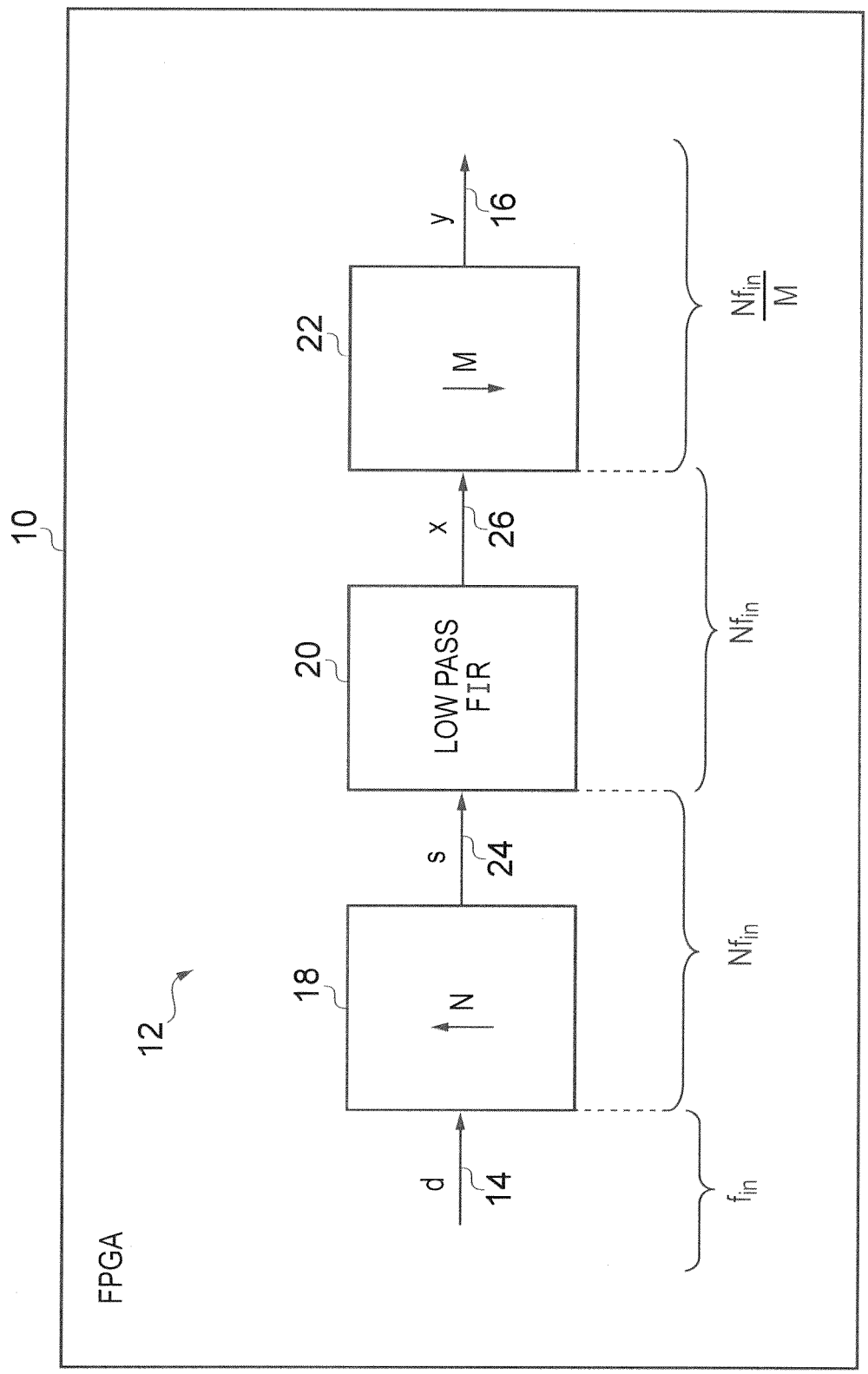
FIG. 1 is a block diagram schematically illustrating an FPGA implementing a sample rate conversion process.

FIG. 1 illustrates an FPGA 10, which is in an SDR (not shown). To meet the processing requirements of the SDR, the FPGA 10 is arranged to implement a fractional delay filter 12 for adjusting the sampling rate of a signal 14, which comprises a stream of digital values d, by a non-integer factor to produce a signal 16 comprising a stream of data values y. The fractional delay filter 12 comprises an interpolator 18, a finite impulse response (FIR) filter 20 and a decimator 22 operating in series on the signal 14 to produce the signal 16.

The data rate of signal 14 is $f_{in}$. The interpolator 18 increases the data rate of the signal 14 by a factor of N (an integer) to produce a signal 24 which comprises a stream of digital values s. The interpolator 18 produces signal 24 by inserting N−1 zero-valued digital samples after each digital value in signal 14. This process is commonly known as zero padding. The data rate of the interpolator 18 and its output signal 24 is $Nf_{in}$. The FIR filter 20 is arranged to lowpass filter signal 24 to produce signal 26, which comprises a stream of digital values x. The lowpass filtering performed by the FIR filter 20 serves to avoid aliasing in the signal 16 produced by the fractional delay filter 12. The data rate of the FIR filter 20 and its output signal 26 is $Nf_{in}$. The signal 26 is then supplied to the decimator 22 which reduces the data rate of the signal by a factor of M (which is an integer value) in order to produce signal 16 at the final sampling rate. The decimator 22 operates by selecting only every $M^{th}$ value of signal 26 for inclusion in signal 16. The data rate of the decimator 22 and its output signal 16 is $$\frac{Nf_{in}}{M}.$$

The data rates of the various signals and stages in the fractional delay filter 12 are shown in FIG. 1.

Figure 2:
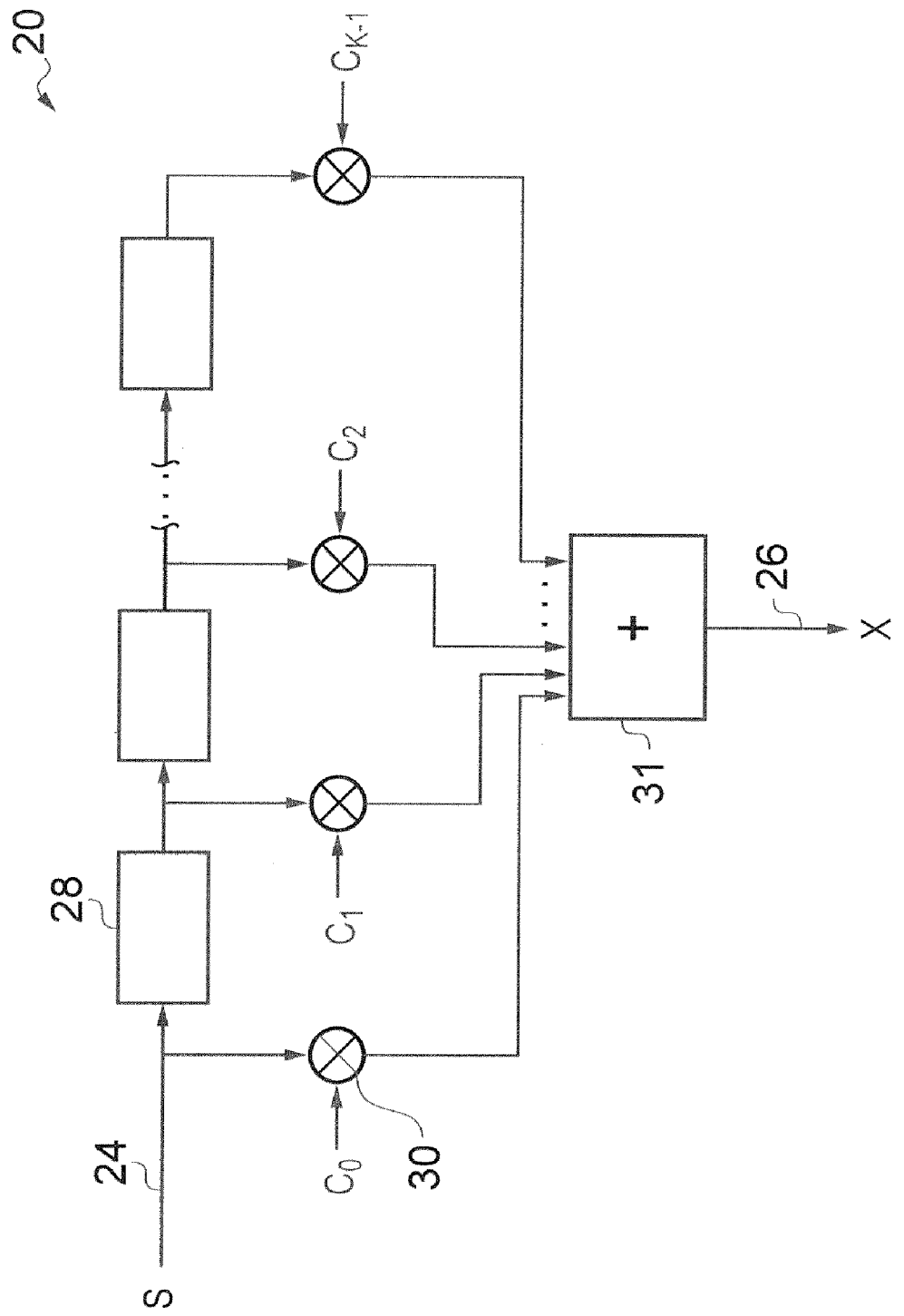
FIG. 2 is a block diagram schematically illustrating a direct form FIR filter.

FIG. 2 shows the format of the FIR filter 20. The signal 24 is fed into a chain of delay elements, e.g., 28, each of which holds a digital value of the signal 24 for one clock cycle before then passing the value on to the next delay element in the chain. The contents of the delay elements are supplied as inputs to respective multipliers, e.g., 30. Each multiplier receives a respective coefficient as another input and each multiplier produces as an output the product of the delay element value and the coefficient that are its inputs. The outputs of the multipliers are then summed in adder 31 to produce signal 26 for application to the decimator 22. As is well known, the characteristics of the filtering process that is conducted by FIR filter 20, such as the width of its pass band, are controlled by the specific values that are given to the coefficients. In the example shown in FIG. 2, there are K (which is an integer value) delay elements in the chain such that there are also K multipliers. The coefficients that are applied to the multipliers are labelled $C_0$ to $C_{K-1}$.

The zero padding that is present in signal 24 facilitates a polyphase decomposition of the FIR filter 20, as will now be explained. The signal 24 has the following format:

$$s = d_0 0 0 0 \ldots 0 d_1 0 0 0 \ldots 0 d_2 0 0 0 \ldots 0 d_3 \ldots$$

where there are N−1 zeroes after each d value.

Thus, successive values of signal x follow the sequence:

$$x_0 = C_0 d_0 + C_1 0 + \ldots + C_{N-1} 0 + C_N d_1 + C_{N+1} 0 + \ldots + C_{2N-1} 0 + C_{2N} d_2 + C_{2N+1} 0 + \ldots$$

$$x_1 C_0 0 + C_1 d_0 + \ldots + C_{N-1} 0 + C_N 0 + C_{N+1} d_1 + \ldots + C_{2N-1} 0 + C_{2N} 0 + C_{2N+1} d_2 + \ldots$$

$$\vdots$$

$$x_{N-1} = C_0 0 + C_1 0 + \ldots + C_{N-1} d_0 + C_N 0 + C_{N+1} 0 + \ldots + C_{2N-1} d_1 + C_{2N} 0 + C_{2N+1} 0 + \ldots C_{3N-1} d_2 + \ldots$$

Thus, at any given time, only a subset of coefficients $C_0$ to $C_{K-1}$ are actively involved in producing a value of signal x. These subsets are:

$$P_0 = \{C_0, C_N, C_{2N}, \ldots\}$$

$$P_1 = \{C_1, C_{N+1}, C_{2N+1}, \ldots\}$$

$$\vdots$$

$$P_{N-1} = \{C_{N-1}, C_{2N-1}, C_{3N-1}, \ldots\}$$

The subsets $P_0$ to $P_{N-1}$ are phases of a polyphase decomposition of the FIR filter 20. Using this concept of filter phases, the interpolator 18 and the FIR filter 20 of FIG. 1 can be implemented together by the circuit shown in FIG. 3.

Figure 3:
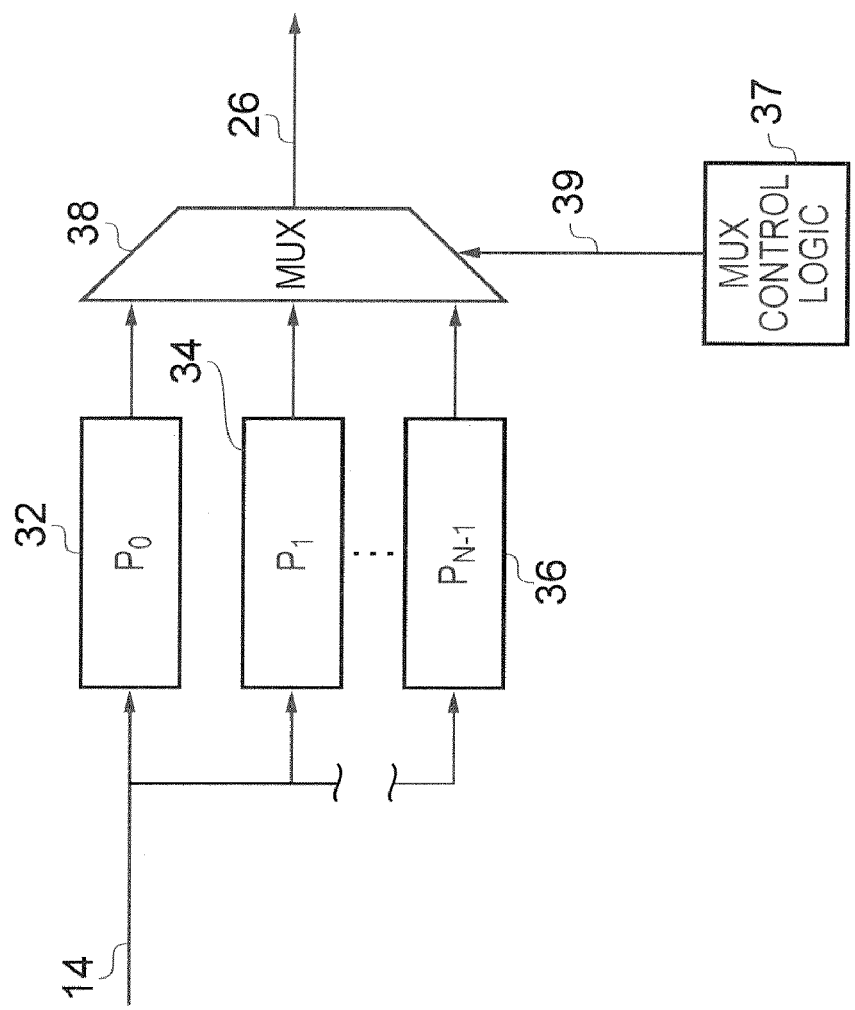
FIG. 3 is a block diagram schematically illustrating the polyphase decomposition of a filtering process operating on a zero padded signal.

In FIG. 3, the signal 14 is supplied in parallel to N FIR filters, of which three filters 32, 34 and 36 are shown. The outputs of these filters become the inputs of an N to 1 multiplexer 38 whose output is the signal 26 that is applied to the decimator 22. Each of the filters that feed into the multiplexer 38 is programmed with a coefficient set of a different one of the phases $P_0$ to $P_{N-1}$. The filters shown in FIG. 3 all operate at the data rate of signal 14, i.e., $f_{in}$. The multiplexer 38 operates at a rate of $Nf_{in}$ and selects the outputs of the filters in turn to produce the signal 26. In this scheme, the control logic 37 that produces the control signal 39 that is applied to the multiplexer 38 for selecting which of its inputs becomes its output can be a simple upcounter.

Figure 4:
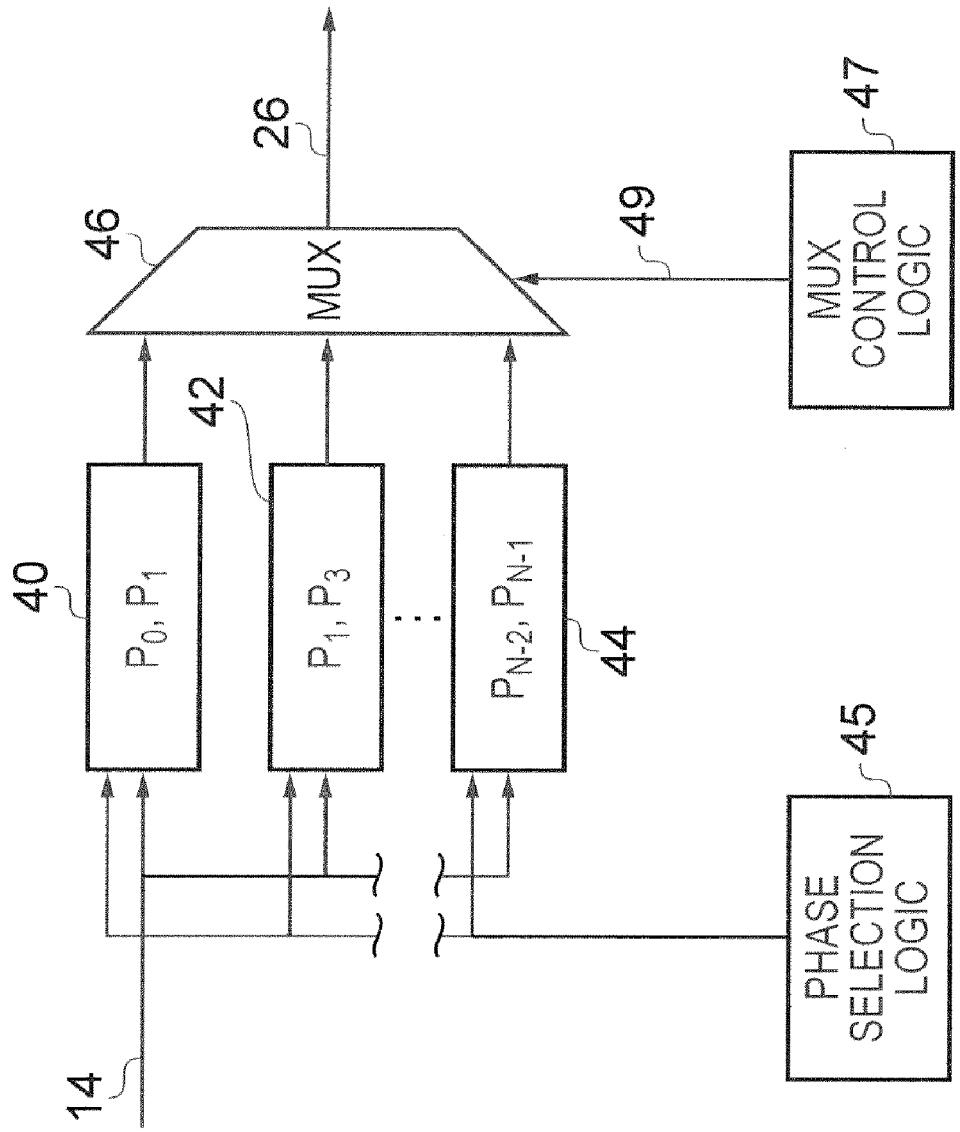
FIG. 4 shows a development of the FIG. 3 scheme, in which the filters are time-shared between phases.

If the system clock rate is much higher than the data rate of signal 26, then some or all of the filters shown in FIG. 3 can be implemented as a single filter with two or more coefficient sets. This allows optimal use of hardware resources, such as multipliers and memory, and reduces the size of the multiplexer unit. FIG. 4 shows an adaptation of the circuit of FIG. 3 in which each of the filters implements two of the phases.

As in FIG. 3, FIG. 4 shows a group of FIR filters, of which 40, 42 and 44 are shown, operating in parallel on the signal 14 to produce inputs for an N/2 to 1 multiplexer 46. Each of the filters implements two of the phases $P_0$ to $P_{N-1}$ (it being assumed that N is even for the sake of simplicity). Accordingly, there are half as many filters in FIG. 4 as there are in FIG. 3. Whilst the data rate of signal 14 is $f_{in}$, the filters in FIG. 4 all operate at a data rate of $2f_{in}$ and the multiplexer 46 operates at a rate of $Nf_{in}$ in order to produce signal 26.

In operation, the coefficients of each of the filters in FIG. 4 is swapped between the coefficient sets of its pair of phases. For example, filter 40 swaps between states in which it is configured to implement phase $P_0$ and in which it is configured to implement phase $P_1$. This reconfiguration process is controlled by phase selection logic 45 which reconfigures the filters in time to supply the multiplexer 46 with the phase outputs that it needs to deliver as its output. The control logic 47 that provides the signal 49 that controls which of its inputs the multiplexer 46 delivers as its output is necessarily more complex than in FIG. 3 but the multiplexer itself is less complex than its FIG. 3 counterpart in that it has to cope with half as many inputs.

It should also be kept in mind that, in addition to combining several phases on a single filter, it is possible to achieve a further reduction in the number of multipliers that are required by further time sharing of multipliers, if the clock rate is sufficiently higher than the data rate, by performing "folding". In "folding" a multiplier is reused to carry out two or more of the multiplications that are required to feed into a summation to produce a single output of a filter.

The output signal of the multiplexer 38 at any given time can be described as the output of phase $P_b^a$, where a is the index of the earliest sample of the signal d that is within the filter in question and b is the index of the phase that the filter is currently implementing, in other words:

$$P_b^a = \sum_{a=0}^{\frac{N}{K}-1} C_{b+aN} \times d_{a+a}$$

Thus, the signal x can be described as the series of phase outputs:

$$P_0^0, P_1^0, P_2^0, \ldots P_{N-1}^0, P_0^1, P_1^1, P_2^1, \ldots P_{N-1}^1, \ldots$$

The multiplexers 38 and 46 perform selection processes, as does decimator 22. FIGS. 5 to 8 disclose variants of the fractional delay filter 12 in which the selection process of the decimator 22 has become part of the selection process that is performed by the multiplexer that selects FIR filter outputs.

Figure 5:
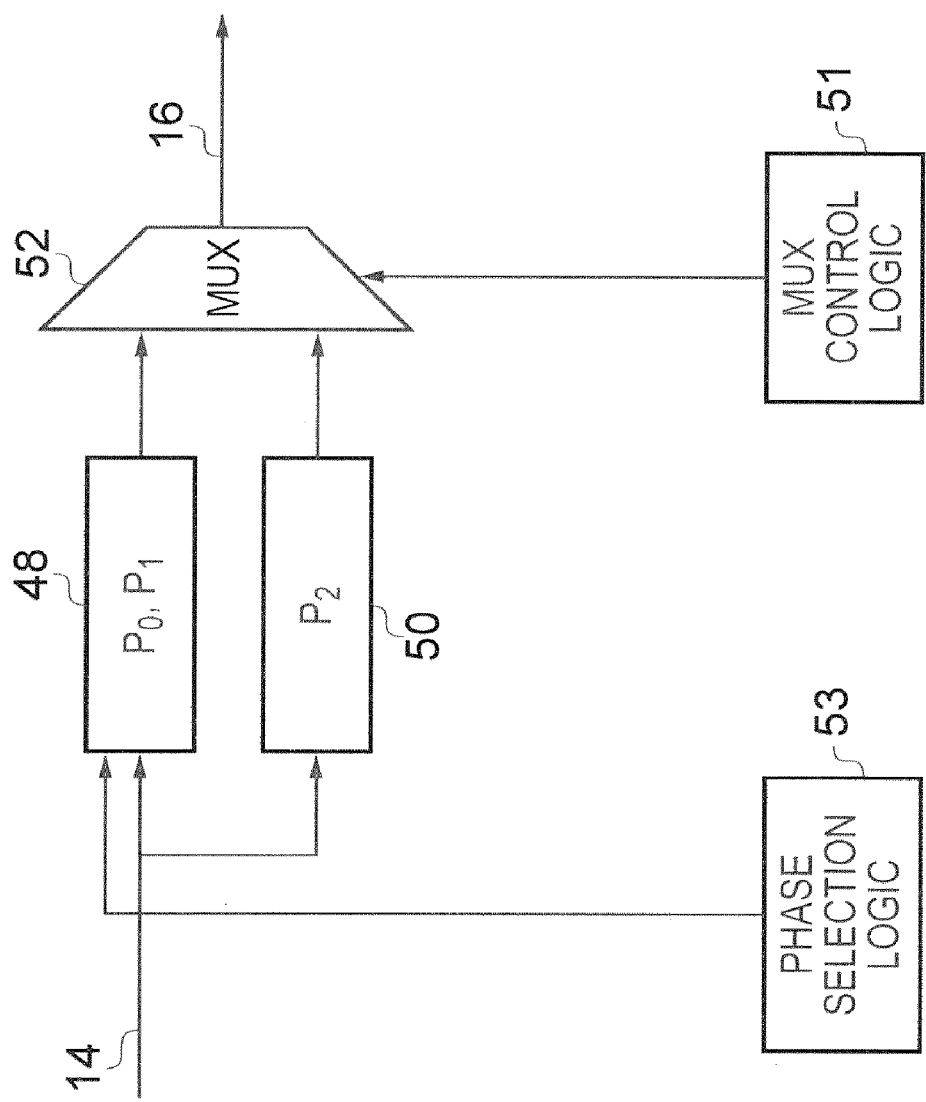
FIG. 5 is a block diagram schematically illustrating a sample rate conversion scheme in which a decimation process is subsumed within the operation of a multiplexer that conveys the outputs of filters implementing phases of a polyphase decomposition.
Figure 6:
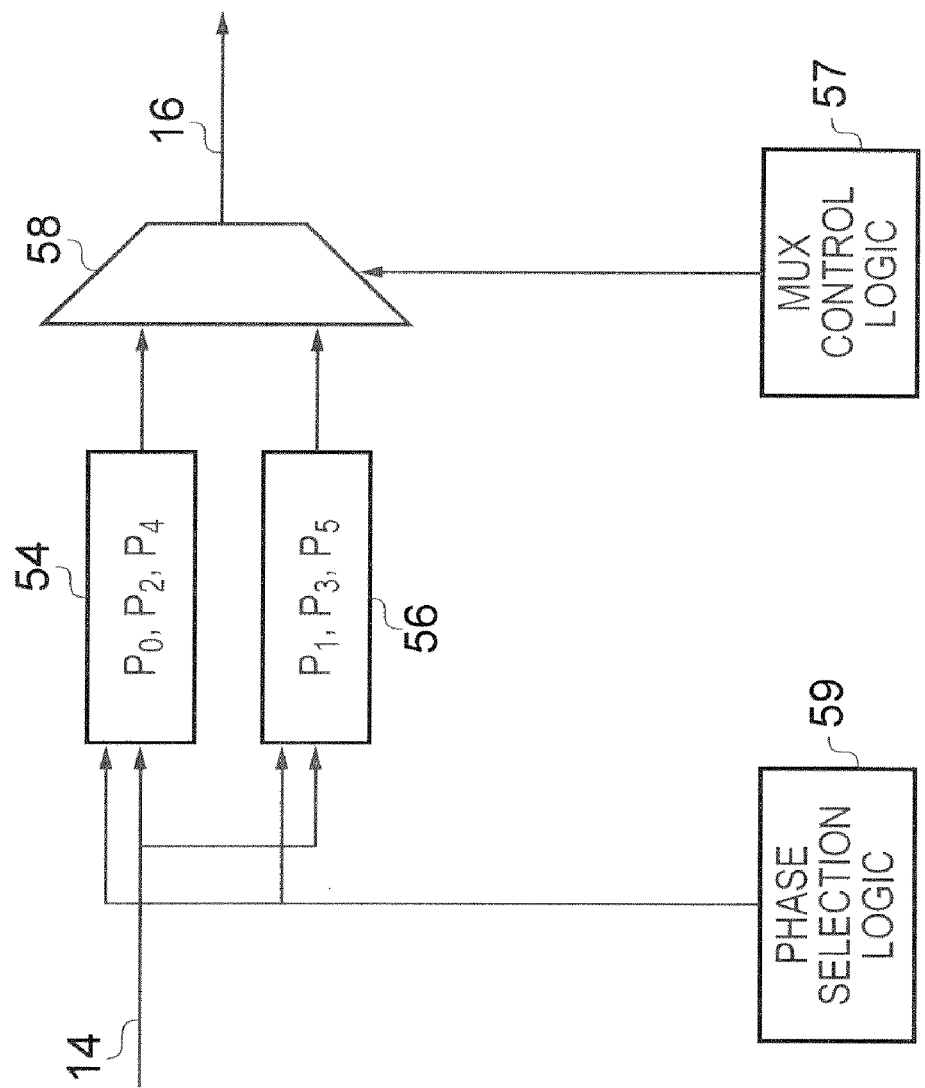
FIG. 6 shows a variant of the scheme of FIG. 5 for a different sample rate conversion ratio.
Figure 7:
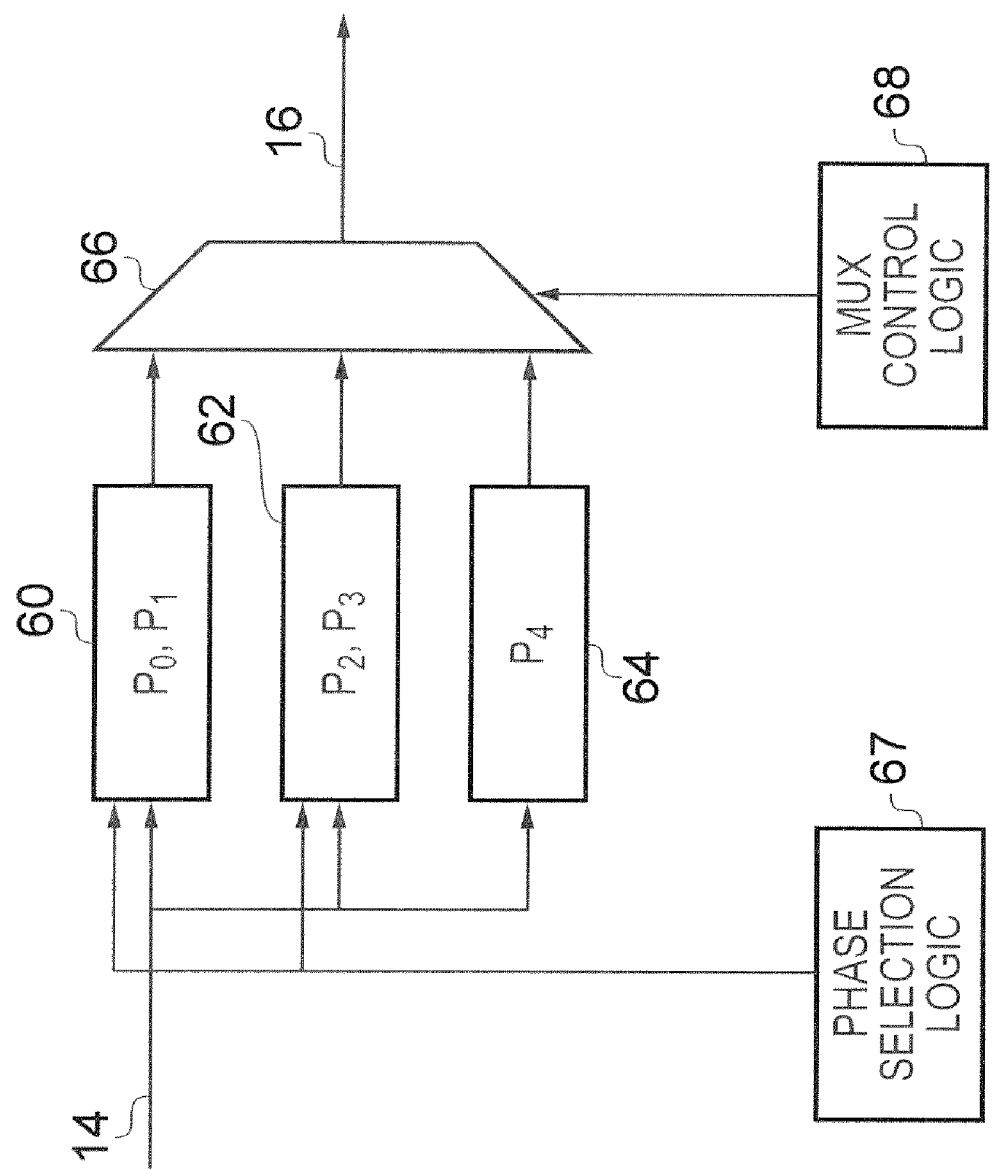
FIG. 7 shows a yet further variant of the scheme of FIG. 5 for yet another sample rate conversion ratio.

In order to cause the multiplexer to output the correct value for the $i^{th}$ sample of signal y given a sample conversion ratio of N/M, the multiplexer must provide as its output the phase output $P_b^a$ where:

$$a=((i-1))M) \text{ div} N$$

and $$b=((i^{-1})M) \text{ mod } N$$

where i is a natural number. FIGS. 5, 6 and 7 provide specific examples for the cases where the sample rate conversion ratio N/M is 3/2, 6/5 and 5/2, respectively.

In FIG. 5, the FPGA 10 implements two FIR filters 48 and 50 and a multiplexer 52. The signal 14 is applied in parallel to the FIR filters 48 and 50. The filters 48 and 50 are used to implement various phases of the N=3 decomposition of the coefficient set of the FIR filter 20. Specifically, the FIR filter 48 is configured to swap its configuration between phases $P_0$ and $P_1$ of that N=3 decomposition and the FIR filter 50 is configured to implement phase $P_2$ of that N=3 decomposition. The data rate of signal 14 is $f_{in}$, whereas the data rates of FIR filters 48 and 50 are $f_{in}$ and $f_{in}/2$, respectively. This means that FIR filter 48 must produce an output value for every value of signal 14, with consecutive output values of the FIR filter 48 being from alternate ones of its $P_0$ and $P_1$ configurations, and that the FIR filter 50 is only required to produce an output for every other value of the signal 14. The multiplexer 52 operates at a data rate $3f_{in}/2$.

The control logic 51 of multiplexer 52 is designed to cause the multiplexer to select its output on the basis of the formulae given for a and b above. Likewise, the phase selection logic 53 is designed to time the reconfiguration of FIR filter 48 so that the correct phase outputs are available for selection by the multiplexer 52 at the right times. In operation, the phase selection logic 53 and the multiplexer control logic 51 conspire such that the stream of phase outputs that the multiplexer 52 delivers as signal 16 follows the sequence below:

$$P_0^0, P_2^0, P_1^1, P_0^2, P_2^2, \ldots$$

FIG. 6 shows a fractional delay filter implemented by the FPGA 10 and designed to achieve a sample rate conversion ratio of N/M=6/5. In this example, the FPGA implements two FIR filters 54 and 56 and a multiplexer 58. The signal 14 is applied in parallel to the FIR filters 54 and 56 and the output of multiplexer 58 is the signal 16. The filters 54 and 56 are used to implement various phases of the N=6 decomposition of the coefficient set of the FIR filter 20. Specifically, the FIR filter 54 is configured to swap amongst configurations that implement phases $P_0$, $P_2$ and $P_4$ of that N=6 decomposition. Likewise, FIR filter 56 is configured to swap amongst configurations for phases $P_1$, $P_3$ and $P_5$ of that N=6 decomposition. The data rate of the signal 14 is $f_{in}$, each of the filters 54 and 56 has a data rate of 6 $f_{in}/10$ and the multiplexer 58 is operated at a data rate of $6f_{in}/5$.

The control logic 57 of multiplexer 58 is configured to cause the multiplexer to select outputs in accordance with the equations given for a and b above. Likewise, the phase selection logic 59 is designed to time the reconfiguration of the FIR filters 54 and 56 so that the correct phase outputs are available for selection by the multiplexer 58 at the right times. In operation, the phase selection logic 59 and the multiplexer control logic 57 conspire such that the series of phase outputs that the multiplexer 58 delivers as signal 16 follows the sequence below:

$$P_0^0, P_5^0, P_4^1, P_3^2, P_2^3, P_1^4, P_0^5, P_5^5, \ldots$$

FIG. 7 shows a fractional delay filter implemented by the FPGA 10 and designed to achieve a sample rate conversion ratio of N/M=5/2. In this example, the FPGA implements three FIR filters 60, 62 and 64 and a multiplexer 66. The FPGA 10 also implements phase selection logic 67 and multiplexer control logic 68. The signal 14 is supplied in parallel to the FIR filters 60, 62, 64 and the outputs of these filters are selected in a particular sequence by the multiplexer 66 such that the output of the multiplexer is signal 16. The filters 60, 62 and 64 are used to implement various phases of the N=5 decomposition of the coefficient set of the FIR filter 20. Specifically, the FIR filter 60 is configured to swap its configuration between phases $P_0$ and $P_1$ of that N=5 decomposition, FIR filter 62 is configured to swap its configuration between phases $P_2$ and $P_3$ of that N=5 decomposition and filter 64 is configured to implement phase $P_4$ of that N=5 decomposition.

The phase selection logic 67 controls the timing of the reconfiguration of FIR filter 60 between phases $P_0$ and $P_1$ and also controls the timing of the reconfiguration of FIR filter 62 between phases $P_2$ and $P_3$. The multiplexer control logic 68 controls the sequence in which the multiplexer 66 includes the outputs of filters 60, 62 and 64 in signal 16. The multiplexer control logic 68 is designed such that the multiplexer 66 selects the outputs of filters 60, 62 and 64 in accordance with the equations given earlier for a and b. The phase selection logic 67 controls the reconfiguration of filters 60 and 62 amongst their available phases to ensure that the correct phase outputs are available for selection by the multiplexer 66 at the right times. In operation, the stream of values that is output by the multiplexer 66 follows the sequence:

$$P_0^0, P_2^0, P_4^0, P_1^1, P_3^1, P_0^2, P_2^2, P_4^2, \ldots$$

In accordance with previous notation, the data rate of the signal 14 is $f_{in}$ and the data rate of the multiplexer 66 is $5f_{in}/2$. The filter 60 outputs values at a data rate of $f_{in}$ with consecutive values alternating between its $P_0$ and $P_1$ phases. Similarly, filter 62 operates at a data rate of $f_{in}$, with consecutive output values being generated by alternate ones of its $P_2$ and $P_3$ phases. Filter 64 operates at a data rate of $f_{in}/2$ and only needs to output a value for every other value of signal 14.

Thus, FIGS. 5, 6 and 7 illustrate how FIR filters can be time shared between different phases of a polyphase decomposition of an anti-aliasing filter in order to produce area efficient implementations of fractional delay filters. Of course, the combinations of phases implemented in the FIR filters of FIGS. 5, 6 and 7 are not the only possibilities for achieving the given sample rate conversion ratios. For example, FIR filter 50 could be eliminated from FIG. 5 and phase $P_2$ could be implemented using FIR filter 48. However, with careful assignment of phases to FIR filters, it is often possible to minimise the data rates used in the FIR filters. An important consideration in attempting to minimise the data rates of FIR filters is that no filter should implement two phases that are responsible for producing two consecutive symbols of signal y.

It is possible to extend the concept of time sharing FIR filters between phases, in a manner that will now be described by reference to the fractional delay filter implementation shown in FIG. 8.

Figure 8:
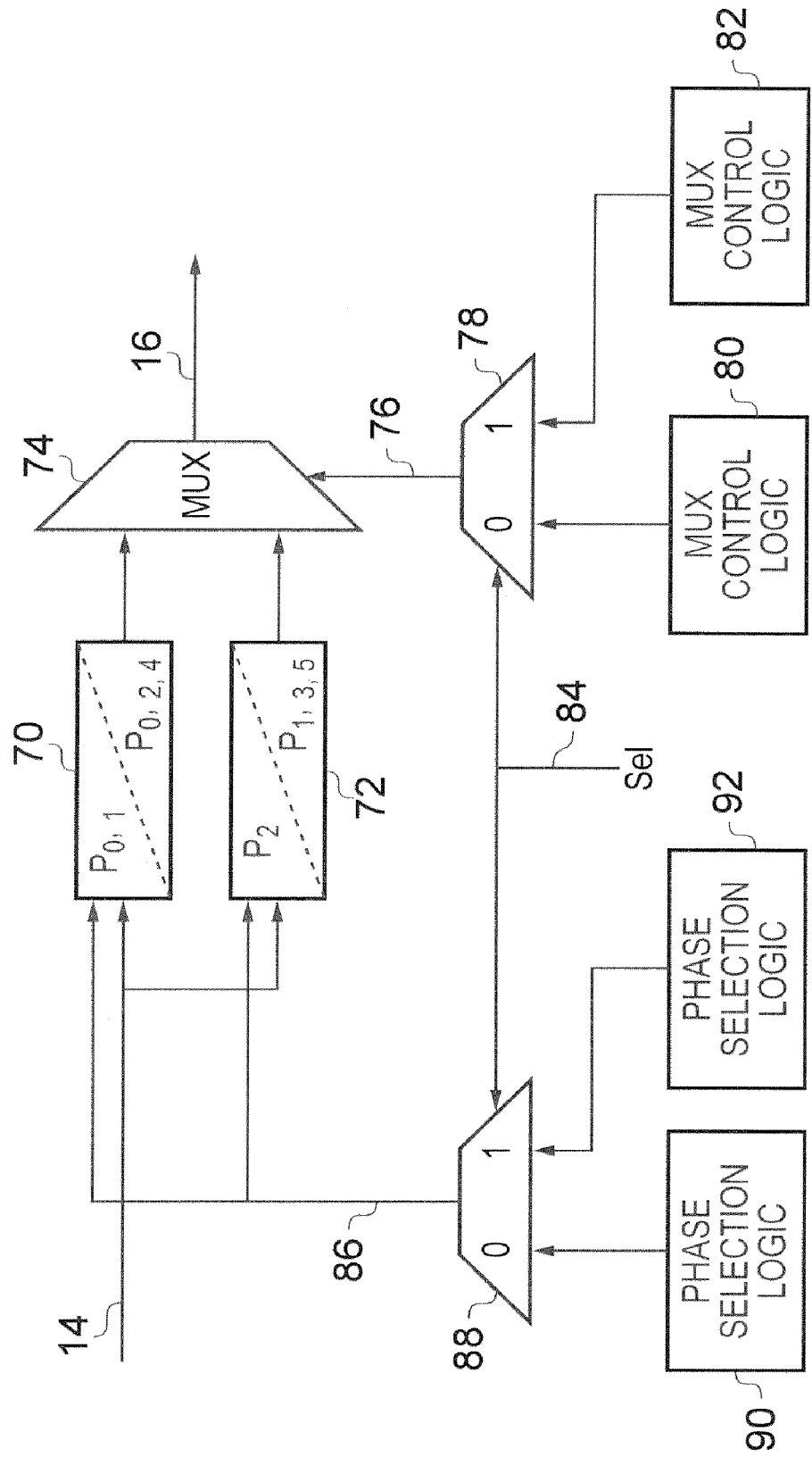
FIG. 8 illustrates schematically a development of the scheme shown in FIG. 4 wherein the filters can be reprogrammed to move between phases of different polyphase decompositions belonging to different sample rate conversion ratios.

The implementation shown in FIG. 8 extends the concept of time sharing FIR filters between phases of a single fractional delay filter design to time sharing FIR filters between different fractional delay filter designs, typically having different sample rate conversion ratios. In FIG. 8, the implementation shown is capable of switching, under the control of the selection signal 84, between a configuration in which a sample rate conversion ratio of N/M=3/2 is achieved and a fractional delay filter configuration in which a sample rate conversion ratio of N/M=6/5 is achieved.

In FIG. 8, the FPGA 10 implements two FIR filters 70 and 72 that provide inputs for a multiplexer 74. The filters 70 and 72 are supplied in parallel with the signal 14 and the output of the multiplexer 74 is the resampled signal 16. The signal 76 that controls the output sequence of the multiplexer 74 comes itself from another multiplexer 78. The FIR filters 70 and 72 are reconfigurable between various phases under the control of a signal 86. The signal 86 is provided by a multiplexer 88. Multiplexer 88 allows the control signal 86 to be supplied by one or the other of two phase selection logic sections 90 and 92. The multiplexers 78 and 88 are both controlled by a signal bit selection signal 84. When the selection signal 84 has the value 0, multiplexer control logic section 80 provides the multiplexer control signal 76 and the phase selection logic section 90 provides the phase selection signal 86. When the signal 84 has the value 1, then the multiplexer control logic section 82 provides the multiplexer control signal 76 and the phase selection logic section 92 provides the phase selection signal 86.

When the signal 84 has the value 0, the elements shown in FIG. 8 are configured to implement the fractional delay filter of FIG. 5. In this case, the configuration of filter 70 is swapped between phases $P_0$ and $P_1$ of the FIG. 5 design under the control of the phase selection logic section 90 and filter 72 is configured to implement phase $P_2$ of the FIG. 5 design. The multiplexer 74 is operated under the control of the multiplexer control logic section 80 to produce as signal 16 the sequence of phase outputs $P_b^a$ that was described earlier with reference to FIG. 5:

$$P_0^0, P_2^0, P_1^1, P_0^2, P_2^2, \ldots$$

When the single bit signal 84 has the value 1, the elements shown in FIG. 8 are configured to implement the fractional delay filter shown in FIG. 6. In this case, the configuration of filter 70 is swapped amongst phases $P_0$, $P_2$ and $P_4$ of the FIG. 6 design under the control of phase selection logic section 92 and the configuration of filter 72 is swapped amongst phases $P_1$, $P_3$ and $P_5$ of the FIG. 6 design, also under control of the phase selection logic section 92. The multiplexer 74 is now controlled by multiplexer control logic section 82 and selects the outputs of the filter 70 and 72 in the correct order so that its output, signal 16, is provided by the sequence of phase outputs $P_b^2$ that was described earlier with reference to FIG. 6:

$$P_0^0, P_5^0, P_4^1, P_3^2, P_2^3, P_1^4, P_0^5, P_5^5, \ldots$$

In designing a scheme like FIG. 8, the FIR filters need to have sufficient multipliers to support the requirements of the phases that are going to be implemented. As an example, assume that the FIG. 5 design utilises phases that result from a N=3 decomposition of an anti-aliasing filter having 51 tap coefficients and that the FIG. 6 design has phases resulting from the N=6 decomposition of an anti-aliasing filter having 96 taps. Thus, the phases in the FIG. 5 design would have 51/3=17 taps, whereas the phases of the FIG. 6 design would have 96/6=16 taps in each phase. If these versions of the FIGS. 5 and 6 designs were to be implemented via the FIG. 8 design, then the FIR filters 70 and 72 would each have to include 17 multipliers in order to accommodate the FIG. 5 phases that are derived from a 51 coefficient anti-aliasing filter. When these 17 coefficient filters are used in the FIG. 6 mode where only 16 coefficients are required, then the coefficient of the spare multiplier in each of filters 70 and 72 is set to 0.

FIG. 8 describes hardware that can be reprogrammed as necessary to implement a desired one of a set sample rate conversion ratios. In the example given, there are two sample rate conversion ratios in the set (3/2 and 5/2) but it is two be understood that the membership of the set can be greater than two. Also, it is to be understood that the set can contain a subset of sample rate conversion ratios where N/M>1 and is an integer.

Earlier, the concept of "folding" was briefly discussed. Folding can be used within the FIR filters in the designs of FIGS. 5 to 8 if the clock rate is sufficiently high.

So far, the Detailed Description has focussed on fractional delay filters implemented in FPGAs. Of course, it will be apparent to readers skilled in the field of DSP that the fractional delay filter designs described in this document could be implemented in other data processing technologies. For example, the fractional delay filter designs described in this document could be implemented in ASICs.

The Detailed Description has described the use of fractional delay filters in the context of SDRs. Of course, the fractional delay filters described in this document are not limited to that field of application.

FIG. 2 provides an exemplary digital filter architecture, specifically, a direct form FIR filter architecture. It will be understood by persons skilled in the art of DSP that other types of filter architecture could be used instead, for example the transposed direct form FIR filter architecture.

Figure 9:
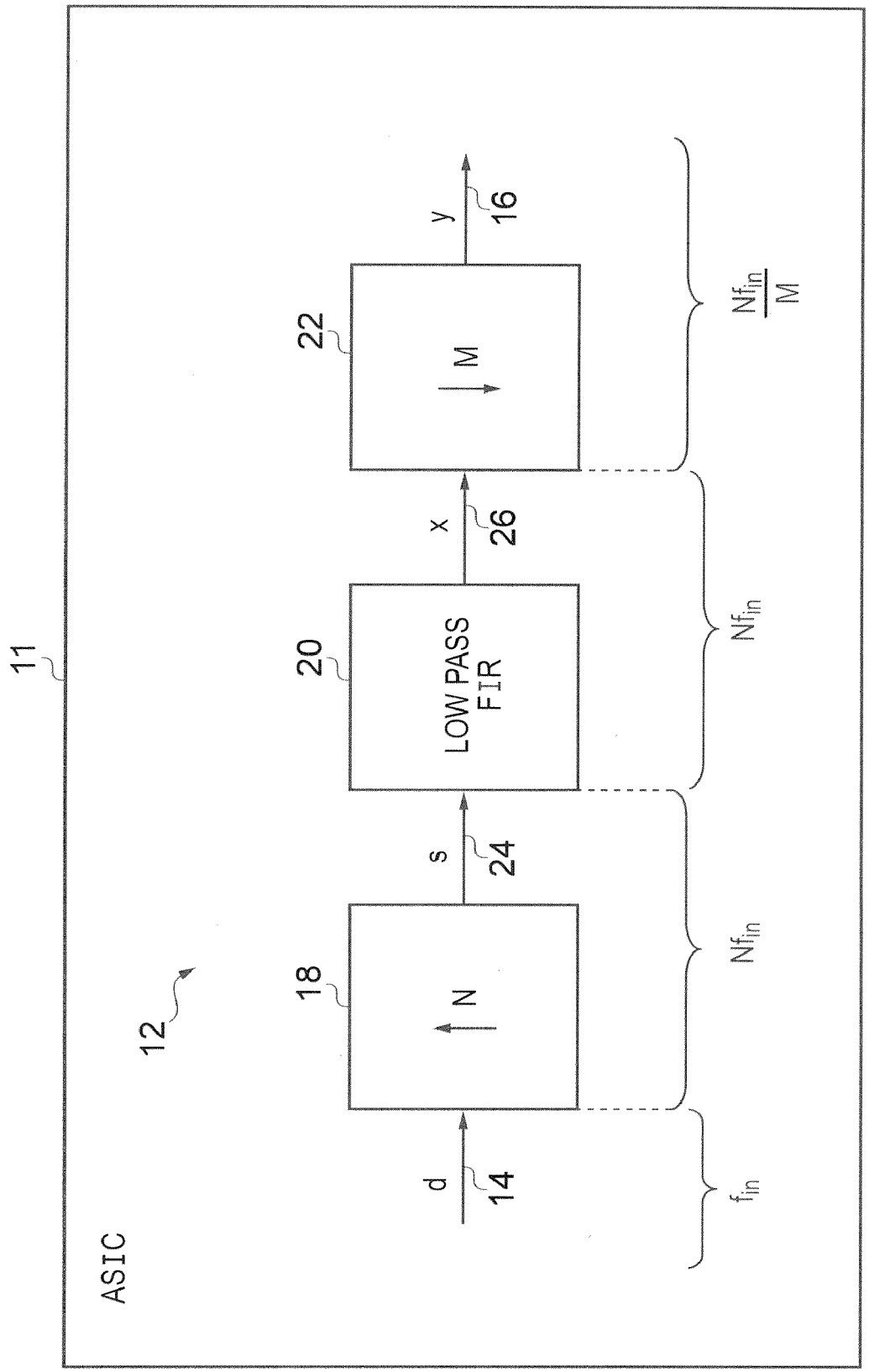
FIG. 9 is a block diagram schematically illustrating the implementation of a sample rate conversion scheme in an ASIC.

FIGS. 3 to 8 describe aspects of the FPGA implemented sample rate converter of FIG. 1. It will be appreciated by persons skilled in the art of digital electronics that these aspects could be implemented equally well using other data processing technologies, such as the ASIC implementation shown in FIG. 9 (where an ASIC 11 is illustrated and where reference numerals carried over from FIG. 1 denote like components).

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

In summary, the present invention is only limited in its scope by the appended claims, to which reference should now be made.

What is claimed is:

1. A sample rate converter for implementing the effect of a sequence upsampling and downsampling processes operating in series on an input signal to produce a resampled signal, wherein said sequence includes anti-aliasing filtering which can be represented as a polyphase decomposition into a set of phases due to zero padding in the upsampling process and the converter comprises:
   a calculator for producing phase outputs, each phase output being the result of a particular phase operating on a particular section of the input signal; and
   a selector for selecting the phase outputs produced by the calculator directly into the correct sequence to produce the resampled signal,
   wherein the calculator comprises a plurality of filters, further wherein at least one filter of the plurality of filters implements more than one phase of the decomposition.

2. A sample rate converter according to claim 1, wherein the filters implement different phases of the decomposition to one another and are supplied with the input signal in order to contribute phase outputs for selection by the selector into the resampled signal.

3. A sample rate converter according to claim 2, wherein at least one of the plurality of filters is arranged to be reconfigurable between configurations in which different phases of the decomposition are implemented.

4. A sample rate converter according to claim 3, further comprising a controller for controlling the timing of the reconfiguration of at least one of said at least one reconfigurable filters.

5. A sample rate converter according to claim 1, wherein the calculator comprises a filter which is supplied with the input signal and which is arranged to be reconfigurable between configurations in which different phases of the decomposition are implemented in order to contribute phase outputs from different phases for selection by the selector into the resampled signal.

6. A sample rate converter according to claim 5, further comprising a controller for controlling the timing of the reconfiguration of the filter amongst its different phases.

7. A sample rate converter according to claim 1, wherein the calculator comprises a filter which is supplied with the input signal and which is arranged to be reconfigurable between configurations in which are implemented different phases of decompositions of different sample rate conversions in order to contribute phase outputs for selection by the selector into the resampled signal.

8. A sample rate converter according to claim 7, wherein a subset of said different conversions are interpolations by integer factors.

9. An FPGA in which the sample rate converter of claim 1 is implemented.

10. An ASIC in which the sample rate converter of claim 1 is implemented.

11. A sample rate converter for implementing the effect of a sequence upsampling and downsampling processes operating in series on an input signal to produce a resampled signal, wherein said sequence includes anti-aliasing filtering which can be represented as a polyphase decomposition into a set of phases due to zero padding in the upsampling process and the converter comprises:
   a calculator for producing phase outputs, each phase output being the result of a particular phase operating on a particular section of the input signal; and
   a controller for repeatedly reconfiguring the calculator to cause the calculator to produce a sequence of phase outputs corresponding directly to the resampled signal,
   wherein the calculator comprises a plurality of filters, further wherein at least one filter of the plurality of filters implements more than one phase of the decomposition.

12. A sample rate converter according to claim 11, wherein the calculator comprises a filter which is supplied with the input signal and which is arranged to be reconfigurable between configurations in which different phases of the decomposition are implemented in order to contribute phase outputs for the resampled signal.

13. A sample rate converter according to claim 11, wherein the calculator comprises a filter which is supplied with the input signal and which is arranged to be reconfigurable between configurations in which are implemented different phases of decompositions of different sample rate conversions in order to allow the selection of the sample rate conversion that is implemented in the resampled signal.

14. A sample rate converter according to claim 13, wherein a subset of said different conversions are interpolations by integer factors.

15. A sample rate converter for implementing the effect of a sequence upsampling and downsampling processes operating in series on an input signal to produce a resampled signal, wherein said sequence includes anti-aliasing filtering which can be represented as a polyphase decomposition into a set of phases due to zero padding in the upsampling process and the converter comprises:
   a multiplexer;
   a plurality of filters operating on the input signal to produce inputs to the multiplexer; and
   control logic for reconfiguring the filters to implement different phases of the decomposition and for selecting which of said inputs becomes the multiplexer output;
   wherein the control logic is arranged to sequence the reconfiguration of the filters and the selection of the multiplexer output such that the multiplexer output is the resampled signal, further wherein at least one filter of the plurality of filters implements more than one phase of the decomposition.

16. A sample rate converter for implementing the effect of a sequence upsampling and downsampling processes operating in series on an input signal to produce a resampled signal, wherein said sequence includes anti-aliasing filtering which can be represented as a polyphase decomposition into a set of phases due to zero padding in the upsampling process and the converter comprises:

a calculator for producing phase outputs, each phase output being the result of a particular phase operating on a particular section of the input signal; and a selector for selecting the phase outputs produced by the calculator directly into the correct sequence to produce the resampled signal, wherein the calculator comprises a filter which is supplied with the input signal and which is arranged to be reconfigurable between configurations in which are implemented different phases of decompositions of different sample rate conversions in order to contribute phase outputs for selection by the selector into the resampled signal.

17. A sample rate converter according to claim 16, wherein a subset of said different conversions are interpolations by integer factors.

18. A sample rate converter for implementing the effect of a sequence upsampling and downsampling processes operating in series on an input signal to produce a resampled signal, wherein said sequence includes anti-aliasing filtering which can be represented as a polyphase decomposition into a set of phases due to zero padding in the upsampling process and the converter comprises:

a calculator for producing phase outputs, each phase output being the result of a particular phase operating on a particular section of the input signal; and a controller for repeatedly reconfiguring the calculator to cause the calculator to produce a sequence of phase outputs corresponding directly to the resampled signal, wherein the calculator comprises a filter which is supplied with the input signal and which is arranged to be reconfigurable between configurations in which are implemented different phases of decompositions of different sample rate conversions in order to allow the selection of the sample rate conversion that is implemented in the resampled signal.

19. A sample rate converter according to claim 18, wherein a subset of said different conversions are interpolations by integer factors.

* * * * *